(12) United States Patent
Jan et al.

(10) Patent No.: US 8,592,927 B2
(45) Date of Patent: Nov. 26, 2013

(54) MULTILAYERS HAVING REDUCED PERPENDICULAR DEMAGNETIZING FIELD USING MOMENT DILUTION FOR SPINTRONIC APPLICATIONS

(75) Inventors: Guenole Jan, San Jose, CA (US); Ru Ying Tong, Los Gatos, CA (US); Witold Kula, Sunnyvale, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 128 days.

(21) Appl. No.: 13/068,172

(22) Filed: May 4, 2011

(65) Prior Publication Data

US 2012/0280336 A1  Nov. 8, 2012

(51) Int. Cl.
*H01L 29/82* (2006.01)

(52) U.S. Cl.
USPC ............. 257/421; 257/E29.323; 257/E21.665

(58) Field of Classification Search
USPC ........................... 257/421, E29.323, E21.665
See application file for complete search history.

(56) References Cited

U.S. PATENT DOCUMENTS

| | | | |
|---|---|---|---|
| 6,166,948 A | 12/2000 | Parkin et al. | |
| 6,743,503 B1 | 6/2004 | Chen | |
| 6,834,005 B1 | 12/2004 | Parkin | |
| 6,847,510 B2 | 1/2005 | Childress et al. | |
| 6,974,708 B2 | 12/2005 | Horng et al. | |
| 7,335,961 B2 | 2/2008 | Guo et al. | |
| 7,486,551 B1 | 2/2009 | Li et al. | |
| 7,586,781 B2 | 9/2009 | Saitoh et al. | |
| 7,630,232 B2 | 12/2009 | Guo | |
| 7,742,263 B2 | 6/2010 | Fukumoto et al. | |
| 7,817,462 B2 | 10/2010 | Miura et al. | |
| 7,863,060 B2 | 1/2011 | Belen et al. | |
| 7,902,579 B2 | 3/2011 | Lim et al. | |
| 7,936,627 B2 | 5/2011 | Fukami | |
| 2008/0137405 A1 | 6/2008 | Ohno et al. | |

(Continued)

FOREIGN PATENT DOCUMENTS

| JP | 11337527 | 12/1999 |
|---|---|---|
| JP | 2005150303 | 6/2005 |

(Continued)

OTHER PUBLICATIONS

PCT Search Report, MagIC Technologies, Inc., PCT/US12/35097, Mail date—Jul. 16, 2012.

(Continued)

*Primary Examiner* — Timor Karimy
(74) *Attorney, Agent, or Firm* — Saile Ackerman LLC; Stephen B. Ackerman

(57) ABSTRACT

A magnetic element is disclosed that has a composite free layer with a FM1/moment diluting/FM2 configuration wherein FM1 and FM2 are magnetic layers made of one or more of Co, Fe, Ni, and B and the moment diluting layer is used to reduce the perpendicular demagnetizing field. As a result, lower resistance x area product and higher thermal stability are realized when perpendicular surface anisotropy dominates shape anisotropy to give a magnetization perpendicular to the planes of the FM1, FM2 layers. The moment diluting layer may be a non-magnetic metal like Ta or a CoFe alloy with a doped non-magnetic metal. A perpendicular Hk enhancing layer interfaces with the FM2 layer and may be an oxide to increase the perpendicular anisotropy field in the FM2 layer. The magnetic element may be part of a spintronic device or serve as a propagation medium in a domain wall motion device.

21 Claims, 5 Drawing Sheets

(56) References Cited

U.S. PATENT DOCUMENTS

| | | | |
|---|---|---|---|
| 2008/0204946 | A1 | 8/2008 | Ochiai et al. |
| 2008/0278867 | A1* | 11/2008 | Fukumoto et al. ....... 360/324.12 |
| 2009/0213503 | A1 | 8/2009 | Sun et al. |
| 2009/0257151 | A1 | 10/2009 | Zhang et al. |
| 2009/0303779 | A1 | 12/2009 | Chen et al. |
| 2010/0072524 | A1 | 3/2010 | Huai et al. |
| 2010/0090261 | A1 | 4/2010 | Zheng et al. |
| 2011/0014500 | A1 | 1/2011 | Horng et al. |

FOREIGN PATENT DOCUMENTS

| | | |
|---|---|---|
| JP | 2007123640 | 5/2007 |
| WO | WO 2007015474 | 2/2007 |
| WO | WO 2009101827 | 8/2009 |

OTHER PUBLICATIONS

International Search, NEC Corp., Report PCT/JP2009/050287, Mail date—Apr. 21, 2009.

"Current-driven excitation of magnetic multilayers," by J.C. Slonczewski, Journal of Magnetism and Magnetic Materials 159 (1996) L1-L7, Elsevier.

"Current-induced domain wall motion in perpendicularly magnetized CoFeB nanowire," by S. Fukami et al., Applied Physics Letters 98, 082504 (2011), pp. 1-3.

"Growth, structure, electronic, and magnetic properties of MgO/Fe(001) bilayers and Fe/MgO/Fe(001) trilayers," by M. Klaua et al., Physical Review B, vol. 64, 134411, pp. 1-8.

"A perpendicular-anisotropy CoFeB-MgO magnetic tunnel junction," by S. Ikeda et al., Nature materials, Published online: Jul. 11, 2010/ DOI: 10.1038/NMAT2804, www.nature.com/naturematerials, pp. 1-4.

Co-pending US Patent HMG10-038, U.S. Appl. No. 12/931,866, filed Feb. 11, 2011, "Magnetic Element with Improved Out-of-Plane Anisotropy for Spintronic Applications," assigned to the same assignee as the present invention, 36 pgs.

Co-pending US Patent HMG10-023, U.S. Appl. No. 12/927,939, filed Nov. 30, 2010, "Structure and Method for Enhancing Interfacial Perpendicular Anisotropy in CoFe(B)/MgO/CoFe(B) Magnetic Tunnel Junctions," assigned to the same assignee as the present invention, 43 pgs.

* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | -7 |
| Ru | $RuO_2$ | -253 |
| Cu | $CuO$ | -254 |
| Co | $CoO$ | -426 |
| Ni | $NiO$ | -432 |
| Fe | $FeO$ | -488 |
| Fe | $Fe_2O_3$ | -495 |
| Mo | $MoO_2$ | -502 |
| W | $WO_3$ | -509 |
| Sn | $SnO$ | -514 |
| Zn | $ZnO$ | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | $BaO$ | -1056 |
| Hf | $HfO_2$ | -1084 |
| Mg | $MgO$ | -1146 |
| Ca | $CaO$ | -1208 |

FIG. 9

MULTILAYERS HAVING REDUCED PERPENDICULAR DEMAGNETIZING FIELD USING MOMENT DILUTION FOR SPINTRONIC APPLICATIONS

RELATED PATENT APPLICATIONS

This application is related to the following: Ser. No. 12/927,939, filing date Nov. 30, 2010; and Ser. No. 12/931,866, filing date Feb. 11, 2011, assigned to a common assignee and herein incorporated by reference in their entirety.

FIELD OF THE INVENTION

The invention relates to a composite magnetic structure having a layer that reduces saturation magnetization $M_s$ in order to lower the perpendicular demagnetizing field thereby enhancing the perpendicular anisotropy field to lower the resistance-area (RA) product, and increase thermal stability independently of the moment, volume, or crystalline anisotropy for a device with perpendicular to plane magnetization.

BACKGROUND OF THE INVENTION

Magnetoresistive Random Access Memory (MRAM), based on the integration of silicon CMOS with magnetic tunnel junction (MTJ) technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale.

Both field-MRAM and STT-MRAM have a MTJ element based on a tunneling magneto-resistance (TMR) effect wherein a stack of layers has a configuration in which two ferromagnetic layers are separated by a thin non-magnetic dielectric layer. One of the ferromagnetic layers has a magnetic moment that is pinned in a first direction while the other ferromagnetic layer has a magnetic moment which is free to rotate in a direction that is either parallel or anti-parallel to the first direction. As the size of MRAM cells decreases, the use of external magnetic fields generated by current carrying lines to switch the magnetic moment direction of the free layer becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a current perpendicular to plane (CPP) configuration, the spin angular moment of electrons incident on a ferromagnetic layer interacts with magnetic moments of the ferromagnetic layer near the interface between the ferromagnetic layer and non-magnetic spacer. Through this interaction, the electrons transfer a portion of their angular momentum to the ferromagnetic free layer. As a result, spin-polarized current can switch the magnetization direction of the ferromagnetic free layer if the current density is sufficiently high, and if the dimensions of the multilayer are small.

For STT-MRAM to be viable in the 90 nm technology node and beyond, the ultra-small MTJs (also referred to as nanomagnets) must exhibit a magnetoresistive (MR) ratio that is much higher than in a conventional MRAM-MTJ which uses a NiFe free layer and AlOx as the tunnel barrier layer. Furthermore, the critical current density (Jc) must be lower than about $10^6$ A/cm$^2$ to be driven by a CMOS transistor that can typically deliver 100 μA per 100 nm gate width. A critical current for spin transfer switching (Ic), which is defined as $[(Ic^+ + Ic^-)/2]$, for the present 180 nm node sub-micron MTJ having a top-down oval shaped area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgO, or the like. Thus, for high density devices such as STT-MRAM on a gigabit scale, it is desirable to decrease Ic (and its Jc) by approximately an order of magnitude so as to avoid an electrical breakdown of the MTJ device and to be compatible with the underlying CMOS transistor that is used to provide switching current and to select a memory cell.

Several schemes have been presented to use the spin transfer torque mechanism for magnetic based memory such as STT-MRAM, or current induced domain wall motion based MRAM, logic, and sensor applications. Domain wall motion devices are described in U.S. Patent Application 2004/0252539 and WO 2009/101827. In addition, S. Fukami et al. describe domain wall motion in "Current induced domain wall motion in perpendicular magnetized CoFeB nanowire", Applied Physics Letters, 98, 082504 (2011). A preferred implementation is to employ a magnetic tunnel junction (MTJ) with a pinned ferromagnetic layer and free ferromagnetic layer separated by a tunneling oxide layer in a TMR configuration. This scheme has been widely studied for use as a memory element in MRAM or as a sensor in hard disk drive (HDD) heads.

Referring to FIG. 1, two magnetic layers in a TMR configuration are shown with a magnetization pointing out of the plane of the film. Pinned layer 20 has a magnetization pointing in a y-axis direction or perpendicular to the film plane and the free layer 21 has a magnetic moment that is free to rotate either in a (+) or (−) y-axis direction. Thus, free layer and pinned layer magnetizations are parallel or anti-parallel in a quiescent state. Storage of the digital information is provided by the direction of magnetization in the free layer 21.

When the free layer has a magnetization direction perpendicular to the plane of the film as in FIG. 1, the critical current needed to switch the magnetic element is directly proportional to the perpendicular anisotropy field as indicated in equation (1):

$$i_c = \frac{\alpha e M s V H_{k_{eff},\perp}}{g\hbar} \quad (1)$$

where e is the electron charge, α is a Gilbert damping constant, Ms is the saturation magnetization of the free layer, h is the reduced Plank's constant, g is the gyromagnetic ratio, $H_{k_{eff},\perp}$ is the out-of-plane anisotropy field of the magnetic region to switch, and V is the volume of the free layer.

Thermal stability is a function of the perpendicular anisotropy field as shown in equation (2):

$$\Delta = \frac{M_S V H_{k_{\mathit{eff}},\perp}}{2k_B T} \quad (2)$$

In the in-plane out-of-plane configuration represented in FIG. 1, the perpendicular anisotropy field of the magnetic element is expressed in equation (3) as:

$$H_{k_{\mathit{eff}},\perp} = -DM_s + \frac{2K_U^{\perp,s}}{M_s d} + H_{k,\chi,\perp} \quad (3)$$

where D is the demagnetizing factor of the structure, $M_s$ is the saturation magnetization, d is the thickness of the magnetic element, $H_{k,\chi,\perp}$ is the crystalline anisotropy field in the perpendicular direction, and $K_U^{\perp,s}$ is the surface perpendicular anisotropy of the top and bottom surfaces of the magnetic element. According to equation (3), one can see that a reduction in $M_s$ translates directly to a reduction of the perpendicular anisotropy field regardless of the magnetic element shape (D is shape dependent). Therefore, an improved configuration for a magnetic element is needed that enables a reduction in $M_s$ without adversely affecting thermal stability for spintronic applications.

Large uniaxial anisotropy with an easy axis perpendicular to the film surface for Fe films grown on a MgO surface is described by M. Klaua et. al in "Growth, structure, electronic, and magnetic properties of MgO/Fe(001) bilayers and Fe/MgO/Fe(001) trilayers" in Physical Review B, Vol. 64, 134411-1, (2001).

U.S. Pat. No. 6,743,503 describes a multilayer magnetic superlattice structure made of $(Co/Pt)_n$ or $(Co/Pd)_n$ which exhibits very high and controllable perpendicular magnetic coercivity when formed on an appropriate seed layer.

In U.S. Patent Application Pub. 2010/0072524, an oxide antiferromagnetic layer is employed between a free layer and a metal anti-ferromagnetic layer to decrease spin relaxation due to spin flip scattering and thereby reduce spin transfer torque switching current significantly.

In U.S. Pat. No. 7,630,232, a thin non-magnetic layer made of Ta, Cu, Cr, Ru, Os, Rh, Re, Nb, Mo, W, Ir, or V is inserted between two ferromagnetic layers in a SyAF free layer to introduce parallel coupling between the ferromagnetic layers. Similarly, in U.S. Patent Application Pub. No. 2010/0090261, a Ta, Cr, or Ru intermediate layer is formed between two CoFeB layers that are parallel coupled.

U.S. Pat. No. 7,817,462 discloses a non-magnetic layer of Ru, Os, Re, Ti, Cr, Rh, Cu, Pt, or Pd about 4 to 30 Angstrom thick inserted between two magnetic layers to generate antiparallel coupling therebetween. Likewise, U.S. Patent Application Pub. No. 2009/0303779 employs a Ru or Cu as an anti-parallel coupling layer between two free layers.

U.S. Patent Application Pub. No. 2009/0213503 teaches a Ta non-magnetic insertion layer and a Ru coupling layer formed between two free layers.

U.S. Pat. No. 6,166,948 discloses a free layer comprised of two ferromagnetic layers separated by a non-magnetic spacer so that the two ferromagnetic layers are magnetostatically coupled anti-parallel to each other through their respective dipole fields.

U.S. Pat. No. 7,863,060 teaches a CoFeB free layer to achieve a high MR ratio.

In U.S. Patent Application Pub. No. 2011/0014500, a nanocurrent channel (NCC) layer is inserted in a CoFeB free layer to reduce switching current in a spintronic device.

SUMMARY OF THE INVENTION

The objective of the present invention is to provide a magnetic element with a composite free layer having out-of-plane magnetization in which saturation magnetization is reduced to improve thermal stability independently of the moment, volume, or crystalline anisotropy while maintaining a high MR ratio.

According to one embodiment, these objectives are achieved by providing a magnetic tunnel junction (MTJ) comprised of a pinned layer, a tunnel barrier layer, and a magnetic element including a composite free layer having a Ms reducing (moment diluting) layer formed between two magnetic layers (FM1 and FM2). The FM1 layer has a surface that forms a first interface with the tunnel barrier while the FM2 layer has a surface facing away from the tunnel barrier that forms a second interface with a perpendicular Hk enhancing layer which is employed to increase the perpendicular anisotropy field within the FM2 layer, and wherein Hk is the shortened form of $H_{k,\chi,\perp}$ described previously. There is a capping layer as the uppermost layer in the MTJ stack. In an embodiment wherein the perpendicular Hk enhancing layer is an oxide such as MgO, the capping layer is preferably a metal with an energy of oxide formation considerably greater than that of the perpendicular Hk enhancing layer. Thus, the MTJ has a bottom spin valve configuration that may be represented by seed layer/AFM layer/pinned layer/tunnel barrier/composite free layer/perpendicular Hk enhancing layer/capping layer. Both of the first and second interfaces provide strong perpendicular surface anisotropy for FM1 and FM2 layers, respectively.

Each of the FM1 and FM2 layers may be a single layer or a laminate of a Fe alloy with one or more of Co, Ni, and B and with a thickness between 5 and 20 Angstroms. Furthermore, the free layer is engineered such that the interfacial perpendicular anisotropy dominates the anisotropy field in an out-of-plane magnetization configuration also known as a perpendicular magnetic anisotropy (PMA) structure. In one aspect, the moment diluting layer may be one or more of Ta, Al, Si, B, V, Ti, Mg, Hf, Cr, Cu, Ag, and Au. Alternatively, the moment diluting layer may be comprised of CoFe, NiCo, NiFe, or CoFeNi that is doped with one or more of Ta, Al, Si, B, V, Ti, Mg, Hf, Cr, Cu, Ag, Au, or Os wherein the doped metal has a content from 5 to 50 atomic % in the alloy. In yet another embodiment, the moment diluting layer is CoB or FeB that is doped with one or more of Ta, Al, Si, V, Ti, Mg, Hf, Cr, Cu, Ag, Au, or Os.

The perpendicular Hk enhancing layer is made of a material that provides additional interfacial perpendicular anisotropy when contacting the FM2 layer. In a preferred embodiment, both of the tunnel barrier layer and Hk enhancing layer are made of MgO. In this case, the thickness and oxidation state of the MgO in the perpendicular Hk enhancing layer are controlled to give a resistance x area (RA) product smaller than that of the tunnel barrier layer to minimize the reduction in the magnetoresistive (MR) ratio. In an alternative embodiment, the perpendicular Hk enhancing layer may be comprised of other oxides including SiOx, SrTiOx, BaTiOx, CaTiOx, LaAlOx, MnOx, VOx, AlOx, TiOx, and HfOx. In yet another embodiment, the perpendicular Hk enhancing layer may be one of Ru, Ta, Ti, B, V, Mg, Ag, Au, Cu or Cr. Moreover, when the perpendicular Hk enhancing layer is an oxide, the oxide may be embedded with conductive particles made of one or more of Fe, Co, Ni, B, Ru, Cr, Au, Ag, and Cu to lower the resistivity therein.

Alternatively, the free layer may be formed below the tunnel barrier in a top spin valve structure represented by seed layer/perpendicular Hk enhancing layer/composite free layer/tunnel barrier/pinned layer/AFM layer/capping layer. In this case, the FM1 layer is the uppermost layer in the composite free layer and forms a first interface with a bottom surface of the tunnel barrier layer. The FM2 layer is the bottom layer in the composite free layer and forms a second interface with a top surface of the perpendicular Hk enhancing layer.

According to another embodiment of the present invention, the composite free layer with a composition as previously described is part of a domain wall motion device that may have a pinned layer/tunnel barrier/composite free layer/perpendicular Hk enhancing layer/capping layer configuration wherein the width of the pinned layer along an in-plane (x-axis) direction is substantially less than the width of the other layers in the device stack. A magnetization switchable region in the composite free layer is bounded in the x-axis direction by domain walls and is aligned above (z-axis direction) the pinned layer having a fixed magnetization. Free layer magnetization changes from a (+) z-axis direction to a (−) z-axis direction when a switching current is applied in an x-axis direction. The device stack excluding the pinned layer may be part of a wire in an array of wires that store digital information.

BRIEF DESCRIPTION OF THE DRAWINGS

FIG. 9 is a table that lists the free energy of oxide formation for different materials.

DETAILED DESCRIPTION OF THE INVENTION

The present invention is based on the discovery that the perpendicular demagnetizing field in a free layer may be reduced by inserting a moment diluting material thereby increasing the perpendicular anisotropy field to improve thermal stability and lower the RA value in an out-of-plane embodiment. Although the exemplary embodiments depict bottom spin valve and top spin valve configurations in a MTJ element, the present invention also encompasses a dual spin valve as appreciated by those skilled in the art. The magnetic element including the aforementioned composite free layer as a digital information storage layer may be employed in a MTJ as part of a STT-MRAM or other spintronic device, or as propagation medium for a domain wall in a domain wall motion device. The terms interfacial perpendicular anisotropy and surface perpendicular anisotropy may be used interchangeably. A Ms reducing layer is also referred to as a moment diluting layer.

In a related patent application Ser. No. 12/927,939, we disclosed how Heff is reduced by incorporating a nanocurrent channel (NCC) layer in a CoFeB free layer and thereby enhancing interfacial perpendicular anisotropy Hk⊥ (interfacial. In related patent application Ser. No. 12/931,866, we introduced an engineered magnetic element wherein the perpendicular surface anisotropy field is enhanced at multiple free layer interfaces. In spintronic applications where a design goal is to reduce the saturation magnetization of the magnetic element, one must compensate by increasing volume to retain thermal stability as indicated in equation (2). If one is to increase the volume by increasing the thickness of the bit (free layer) and not the area so that the $M_sD$ product is constant, the gain in perpendicular anisotropy field is proportional to the reduction in Ms.

Figure 1:
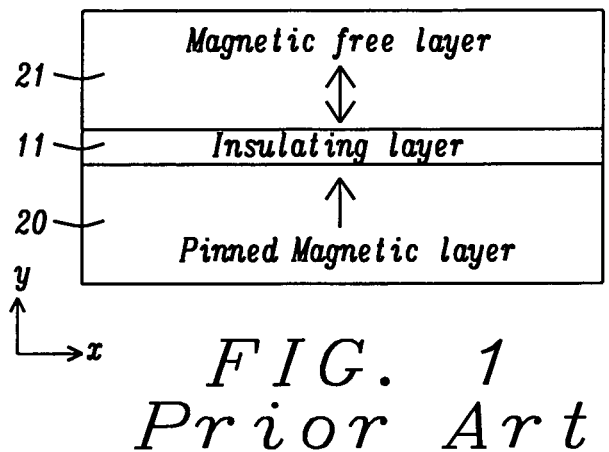
FIG. 1 is a cross-sectional view showing a magnetic tunnel junction (MTJ) with out-of-plane magnetization.

Thus, for the out-of-plane configuration represented in FIG. 1, it is desirable to increase the perpendicular anisotropy field of the magnetic element expressed in equation (3). Herein we disclose additional modifications of a magnetic element to further enhance interfacial perpendicular anisotropy within a composite free layer by lowering the magnetic moment and thereby increasing thermal stability in an out-of-plane embodiment without significantly affecting other performance characteristics such as MR ratio.

Figure 2:
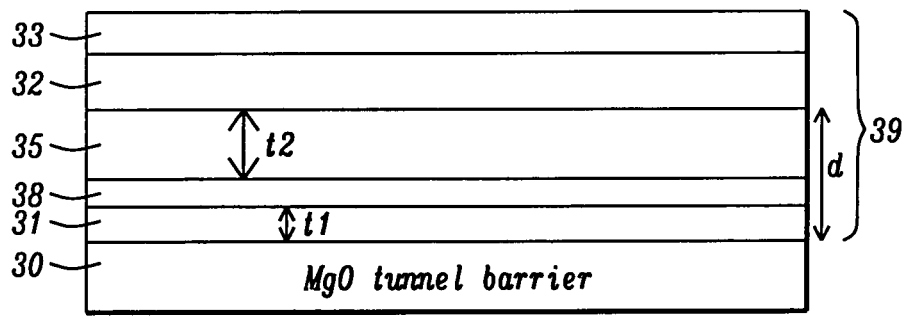
FIG. 2 is a cross-sectional view of a magnetic element wherein a composite free layer has a first magnetic layer adjoining a tunnel barrier layer, a second magnetic layer contacting a perpendicular Hk enhancing layer, and a moment diluting layer between the first and second magnetic layers according to one embodiment of the present invention.

Referring to FIG. 2, one embodiment of the present invention is depicted. A portion of a magnetic element such as a MTJ is shown comprised of a tunnel barrier layer 30 that may be MgO, for example. Above the tunnel barrier is a composite free layer having a thickness d and including a first ferromagnetic (FM1) layer 31, a moment diluting layer 38, and a second ferromagnetic (FM2) layer 35. The magnetic element further includes a perpendicular Hk enhancing layer 32, and a capping layer 33 that are sequentially formed on the FM2 layer. Thus, the modified portion 39 of the magnetic element includes a first interface between the tunnel barrier 30 and a bottom surface of FM1 layer 31, and a second interface formed between a top surface of the FM2 layer 35 and a bottom surface of perpendicular Hk enhancing layer 32. Note that a top surface for a layer in the modified portion is defined as a surface facing away from the tunnel barrier and a bottom surface is one facing the tunnel barrier. As a result of this configuration, there is strong perpendicular surface anisotropy ($K_{U1}^{1,S}$ in equation 3) at the first interface described above. Similarly, a material for the perpendicular Hk enhancing layer 32 is chosen so that the second interface provides strong perpendicular surface anisotropy ($K_{U2}^{1,S}$). The thicknesses t1, t2 of FL1 and FL2 layers, respectively, are thin enough so that the interfacial perpendicular anisotropy ($K_{U1}^{1,S}+K_{U2}^{1,S}$)/$M_s$d within each layer 31, 35 is significant compared with the shape anisotropy field therein. For example, the shape anisotropy field $4\pi Ms$ for a $Co_{20}Fe_{60}B_{20}$ free layer is approximately 12000 Oe. Depending on the composition of the modified portion 39, we have found interfacial perpendicular anisotropy may be greater than 12000 Oe by maintaining thicknesses t1, t2 in a range of 5 to 20 Angstroms. Under such conditions, an out-of-plane magnetization is established in the free layer.

Preferably, the tunnel barrier 30 is made of MgO and is formed by a natural oxidation (NOX) process whereby a first Mg layer is deposited on the pinned layer and subsequently oxidized by a NOX method. Typically, the NOX process comprises an oxygen flow rate of 0.1 to 1 standard liters per minute (slm) for a period of 30 to 500 seconds and with an oxygen pressure from 0.05 to 1 torr. Thereafter, a second Mg layer is deposited on the MgO layer. A subsequent annealing step after the remaining MTJ layers are laid down essentially forms a uniform MgO tunnel barrier layer wherein the second Mg layer in the tunnel barrier stack is oxidized by oxygen diffusion from the underlying MgO layer and by gettering oxygen from the free layer 31. Optionally, the Mg deposition and NOX oxidation sequence may be repeated one or more times before the uppermost Mg layer is deposited on the tunnel barrier stack and subsequently oxidized during an anneal step. In an alternative embodiment, the tunnel barrier layer is made of $Al_2O_3$, TiOx, or HfOx. Furthermore, the tunnel barrier layer may be a laminate of one or more of the aforementioned oxides.

An important feature is that interfacial perpendicular anisotropy is established between oxide and an adjoining magnetic layer. Thus, when a CoFe or CoFeB layer, which normally has in-plane magnetization, contacts an oxide layer such as MgO, the magnetization of the CoFe or CoFeB layers can be aligned out-of-plane under conditions where interfacial perpendicular anisotropy exceeds the shape anisotropy field for the magnetic layer. Although a Fe rich CoFeB layer is preferred for a high MR ratio in a MgO/CoFeB tunnel barrier/FM1 layer configuration, the present invention also anticipates that other alloys of Fe with one or more of Co, Ni, and B may be selected as the FM1 layer 31. In an embodiment where the tunnel barrier is $Al_2O_3$, a Co rich alloy is preferred for the FM1 layer. Likewise, the FM2 layer 35 is preferably made of a Fe alloy with one or more of Co, Ni, and B or a Co rich alloy with one or more of Fe, Ni, and B. The present invention also encompasses an embodiment wherein the FM1 and FM2 layers are made of different materials. For example, the FM1 layer 31 may be CoFeB and the FM2 layer 35 may be CoFe or another CoFeB layer with a different Fe content than in the FM1 layer. Strong surface perpendicular anisotropy is established at an interface between tunnel barrier layer 30 and FM1 layer 31, and at an interface between FM2 layer 35 and perpendicular Hk enhancing layer 32.

In a preferred embodiment, FM1 and FM2 layers both have a magnetic moment in an out-of-plane direction by selecting a thickness and composition of the layers in the modified portion 39 such that the interfacial perpendicular anisotropy dominates the shape anisotropy field in layers 31, 35. As a result, magnetization in the FM1 and FM2 layers is perpendicular to the plane of the layers in the MTJ stack which is a condition known as perpendicular magnetic anisotropy (PMA). Preferably, FM1 and FM2 layers are coupled and have a magnetic moment aligned in the same direction.

Another key feature of all embodiments in the present invention is a moment diluting layer 38 that separates the FM1 and FM2 layers. In one embodiment, the moment diluting layer is non-magnetic with a thickness from 1 to 2 Angstroms and is one or more of Ta, Al, Si, B, V, Ti, Mg, Hf, Cr, Cu, Ag, and Au which decreases the magnetization in the adjoining FM1 and FM2 layers thereby reducing the demagnetizing field of the magnetic element. Furthermore, thickness of each of the FM1 and FM2 layers is preferably from 8 to 11 Angstroms. Thus, combined thickness of the FM1 and FM2 layers is greater than that of a single CoFeB layer previously employed by the inventors to increase free layer volume and thereby compensate for a loss of Ms in equation (2) presented previously. As a result, thermal stability in a composite free layer with FM1/Ta/FM2 configuration is not adversely affected compared with a single free layer made of FM1 or FM2.

Alternatively, the moment diluting layer is an alloy of two or more of Co, Ni, and Fe that is doped with one or more of Ta, Al, Si, V, B, Ti, Mg, Hf, Cr, Cu, Ag, Au, or Os wherein the dopant metal content is between 5 and 50 atomic % in the alloy. In this case, the moment diluting layer has a thickness from 2 to 10 Angstroms and provides additional moment but the magnetization is considerably less than for an equal thickness of an FM1 or FM2 layer. The thickness of each of the FM1 and FM2 layers in this embodiment is preferably between 5 and 11 Angstroms. In effect, the alloy layer 38 with metal dopant in the alternative embodiment is considered a moment diluting layer since a portion of a high magnetization layer in a composite FM1/FM2 free layer is replaced by a low magnetization layer to give a FM1/low moment layer/FM2 stack that has an overall magnetic moment less than in the FM1/FM2 stack at essentially the same thickness. As a result, we have found that the interfacial magnetic and electronic properties of the original magnetic element with a FM1/FM2 (or FM1 or FM2) free layer can be retained in a composite free layer according to the embodiments of the present invention. In other words, high MR ratio and high perpendicular interfacial anisotropy are preserved while achieving a higher thermal stability in FM1/low moment layer/FM2 free layer stack.

The perpendicular Hk enhancing layer 32 is made of a material that provides interfacial perpendicular anisotropy when contacting a surface of FM2 layer 35. In particular, a perpendicular anisotropy field is generated within the FM2 layer in regions proximate to the interface between layers 32, 35. According to one embodiment, the perpendicular Hk enhancing layer 32 is comprised of an oxide, preferably MgO, having a thickness and oxidation state that are controlled to give a resistance x area (RA) product smaller than that of the MgO layer in the tunnel barrier layer 30 in order to minimize a reduction in the MR ratio. The perpendicular Hk enhancing layer may be comprised of other oxides including SiOx, SrTiOx, BaTiOx, CaTiOx, LaAlOx, MnOx, VOx, AlOx, TiOx, or HfOx or may be one of Ru, Ta, Ti, B, V, Mg, Ag, Au, Cu or Cr. Moreover, the perpendicular Hk enhancing layer 32 may be embedded with magnetic particles made of one or more of Fe, Co, Ni, and B with a content of from 20% to 30% by weight of the layer to lower resistivity. For example, Co may be embedded in a MgO layer by first co-sputtering Co and Mg and then performing a natural oxidation (NOX) process. The present invention also anticipates the perpendicular Hk enhancing layer may be a laminate that includes a plurality of oxide layers comprised of one or more of the oxides described above.

Another important feature of the aforementioned embodiments is the material selected for the capping layer 33. In a preferred embodiment, the capping layer is made of Ru. Alternatively, other elements may be chosen for the capping layer. However, materials with a substantially higher free energy of oxide formation compared with the free energy of the oxide employed in the perpendicular Hk enhancing layer 32 are most suitable. FIG. 9 lists the free energy of oxide formation of various elements. Note that if MgO is selected for layer 32, a capping layer material having a free energy of oxide formation substantially higher than −1146 kJ./mole is preferred. Thus, elements near the top of the table in FIG. 9 are preferred over elements near the bottom of the table since the former have a less negative value (higher energy of oxide formation) than the latter. It follows that Ta is less desirable than Ru as the capping layer since Ta has an affinity for oxygen close to that of Mg which means oxygen is more likely to migrate from the MgO Hk enhancing layer into a Ta capping layer than into a Ru capping layer during annealing. A loss of oxygen from a perpendicular Hk enhancing layer comprised of an oxide lowers the interfacial perpendicular anisotropy at the interface with the FM2 layer thereby reducing the induced PMA in the FM2 layer 35. The largest advantage provided by a magnetic element of the present invention occurs when the greatest amount of PMA is induced in the FM1 and FM2 layers as a result of the interfaces with tunnel barrier 30 and perpendicular Hk enhancing layer 32, respectively, and when a substantial reduction in magnetic moment in FM1 and FM2 layers is realized as a result of inserting moment diluting layer 38 in the free layer stack. In an embodiment wherein the capping layer 33 is a composite as in Ru/Ta or Ru/Ta/Ru, the lowermost layer (not shown) should have a high energy of oxide formation relative to that of an oxide layer 32.

Figure 3:
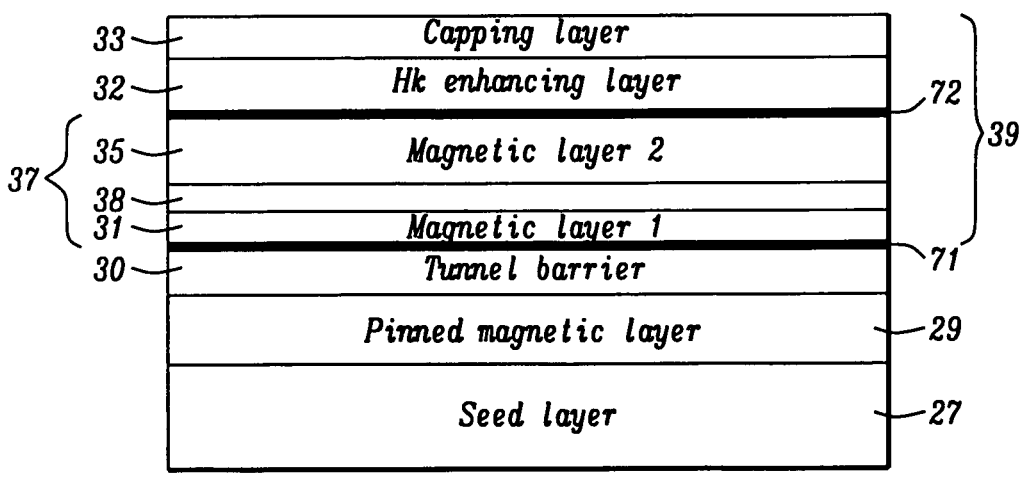
FIG. 3 is a cross-sectional view of a MTJ element formed according to a bottom spin valve embodiment of the present invention wherein interfaces with a tunnel barrier and perpendicular Hk enhancing layer are formed at top and bottom surfaces of a composite free layer.

Referring to FIG. 3, an embodiment is shown where the magnetic element is part of a MTJ that has a bottom spin valve configuration. The MTJ may be formed on substrate such as a bottom electrode (not shown), and comprised of a stack of layers represented by a seed layer/pinned layer/tunnel barrier/composite free layer/Hk enhancing layer/capping layer configuration. The seed layer 27 may be NiCr or other seed materials used in the art. The pinned layer 29 may have a synthetic anti-ferromagnetic (SyAF) structure known as an AP2/coupling/AP1 configuration to improve thermal stability of the MTJ and also reduce the interlayer coupling Hin (offset) field applied to the free layer. In one embodiment, the AP2 and AP1 layers (not shown) are comprised of one or more of CoFe and CoFeB, and the coupling layer is made of Ru.

In the exemplary MTJ embodiment depicted in FIG. 3, the free layer 37 is a composite including a lower FM1 layer 31 which forms a first interface 71 with the insulating layer (tunnel barrier) 30, a middle moment diluting layer 38, and an upper FM2 layer 35 that forms a second interface 72 with an overlying perpendicular Hk enhancing layer 32. There is a capping layer 33 as the uppermost layer in the MTJ stack. An important consideration is that the FM1 layer 31 and tunnel barrier layer 30 are chosen to exhibit the maximum amount of interfacial perpendicular anisotropy. Preferably, the tunnel barrier layer is MgO and the first magnetic layer is comprised of an Fe rich alloy with one or more of Co, Ni, and B such as $Co_{20}Fe_{60}B_{20}$ or $Co_{10}Fe_{70}B_{20}$ wherein the Fe content is 50 atomic % or greater. Likewise, the FM2 layer and perpendicular Hk enhancing layer are selected to provide the maximum amount of interfacial perpendicular anisotropy. Preferably, the perpendicular Hk enhancing layer is made of MgO, TiOx, HfOx, or $Al_2O_3$, and the FM2 layer is an Fe rich alloy with one or more of Co, Ni, and B such as $Co_{20}Fe_{60}B_{20}$ having a Fe content of 50 atomic % or greater. Alternatively, one or both of the FM1 and FM2 layers 31, 35 may be comprised of a Co rich alloy with one or more of Fe, Ni, and B wherein the Co content is about 50 atomic % or higher.

Figure 4:
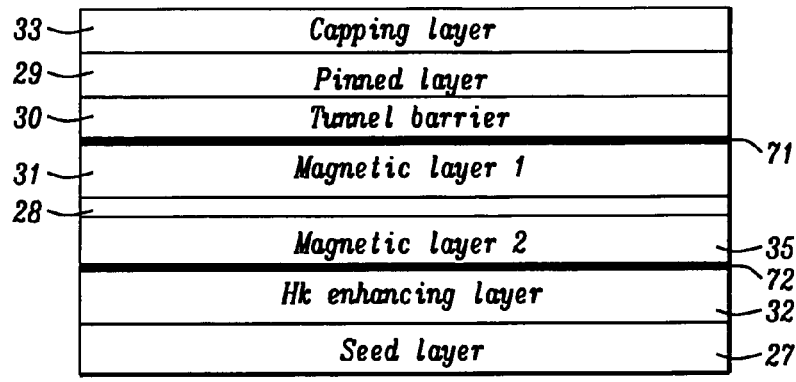
FIG. 4 is a cross-sectional view of a MTJ element formed according to an embodiment of the present invention wherein interfaces with a tunnel barrier and perpendicular Hk enhancing layer are formed at top and bottom surfaces of a composite free layer in a top spin valve configuration.

In an alternative MTJ embodiment depicted in FIG. 4 that represents a top spin valve configuration, a composite free layer may be positioned below the tunnel barrier to give a seed layer/perpendicular Hk enhancing layer/composite free layer/tunnel barrier/pinned layer/capping layer structure. There is a first interface 71 between the first magnetic layer 31 and tunnel barrier layer 30, and a second interface 72 between the second magnetic layer 35 and perpendicular Hk enhancing layer 32 to produce a substantial amount of interfacial perpendicular anisotropy similar in magnitude to that in the bottom spin valve embodiment in FIG. 3. The top spin valve embodiment retains the same features with respect to the composition and properties of the tunnel barrier layer, free layer, and perpendicular Hk enhancing layer as in the bottom spin valve embodiment. However, in this case, the seed layer 27 contacts a surface of the Hk enhancing layer that faces away from the second interface 72 with the free layer. According to one embodiment, the seed layer is made of a metal or alloy, preferably Ru, with a free energy of oxide formation substantially greater than that of the oxide selected for the perpendicular Hk enhancing layer. In an embodiment wherein the seed layer is a composite and the perpendicular Hk enhancing layer is comprised of an oxide, the uppermost layer (not shown) contacting layer 32 should have the high energy of oxide formation relative to that of the aforementioned oxide.

Figure 5:
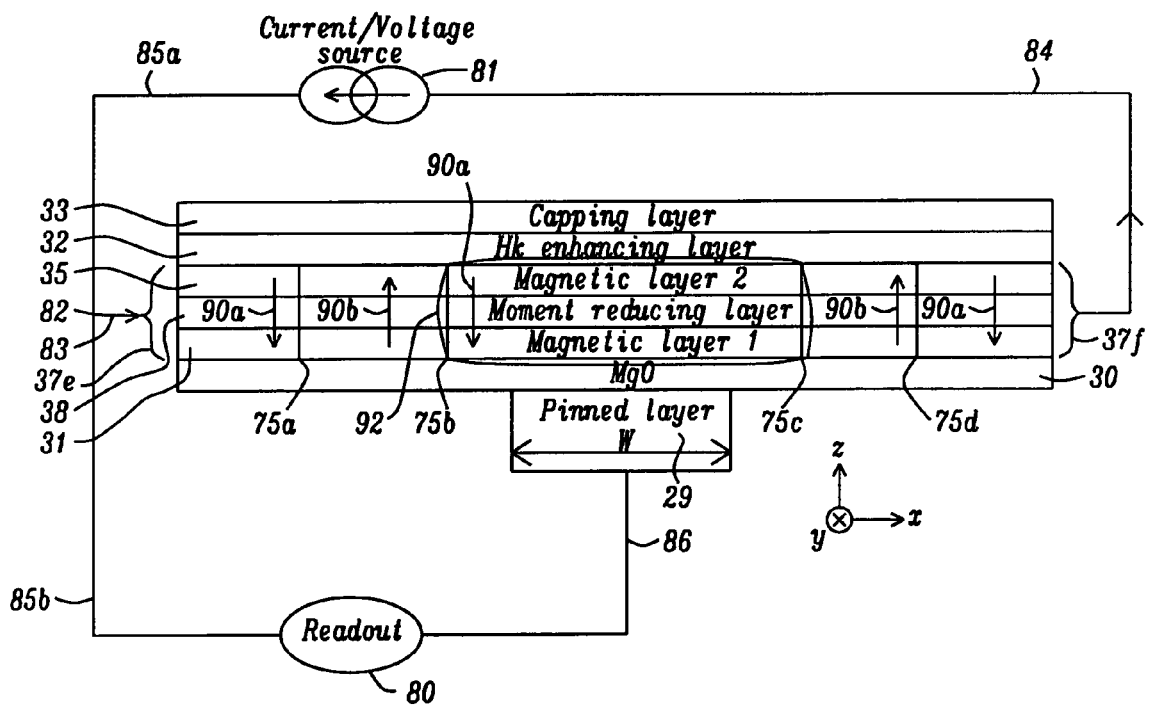
FIG. 5 is a cross-sectional view of a magnetic element based on a domain wall motion structure in a composite free layer according to the present invention.

According to another embodiment of the present invention that is depicted in FIG. 5, the composite free layer described in previous embodiments is part of a domain wall motion device. In one aspect, composite free layer 37 is formed in a MTJ stack having a pinned layer/tunnel barrier/composite free layer/perpendicular Hk enhancing layer/capping layer configuration. A key feature is that pinned layer 29 has a width along an in-plane x-axis direction that is substantially less than the width of the overlying stack of layers. In fact, the stack of layers including tunnel barrier 30, composite free layer 37, perpendicular Hk enhancing layer 32, and capping layer 33 may be patterned to provide a wire which from a top-down view (not shown) is part of an array of wires that are employed for storage of digital information. Another important feature is that composite free layer 37 has a plurality of domain walls (75a-75d) each extending vertically from a top surface that interfaces with layer 32 to a bottom surface which interfaces with tunnel barrier layer 30. There is a magnetic domain bounded by each pair of domain walls within the composite free layer. The moment dilution layer 38 in the FM1/moment dilution layer/FM2 configuration of the composite free layer is made of one or more of Ta, Al, Si, B, V, Ti, Mg, Hf, Cr, Cu, Ag, Au, and Os.

The number of domain walls is variable but is selected as four in the exemplary embodiment for illustrative purposes. In particular, the magnetic domain 92 aligned in a z-axis direction above pinned layer 29 has a switchable magnetization that changes from a (+) z-direction to a (−) z-direction or vice versa when a switching current is applied during a write process. Note that composite free layer has two ends 37e, 37f connected to a current/voltage source 81 in a first electrical loop including wiring 85a to a junction 82 to wire 83 and to end 37e, and a wire 84 attached to end 37f to enable a write process. Furthermore, there is a second electrical loop which allows a readout of digital information in the switchable magnetic domain 92 during a read process. Thus, current can be sent from source 81 through wires 85a, 85b and to readout 80 and then to wire 86 and through pinned layer 29, tunnel barrier 30, and composite free layer before exiting end 37f and returning to the source to complete a circuit. In so doing, the readout device 80 is able to recognize whether the switchable magnetic domain 92 has a magnetization in a (+) z-axis direction 90b or in a (−) z-axis direction 90a.

The composite free layer portion comprised of magnetic layers 31, 35 and the moment diluting layer 38 is advantageous in allowing greater thermal stability even though Ms is reduced to enable higher PMA in layers 31, 35. As mentioned earlier regarding a perpendicular-to-plane embodiment, PMA is enhanced at the interface between first magnetic layer 31 and tunnel barrier 30, and at the interface between second magnetic layer 35 and perpendicular Hk enhancing layer 32. Preferably, pinned layer 29 also has PMA character in this embodiment to generate a stronger read signal.

Figure 6A:
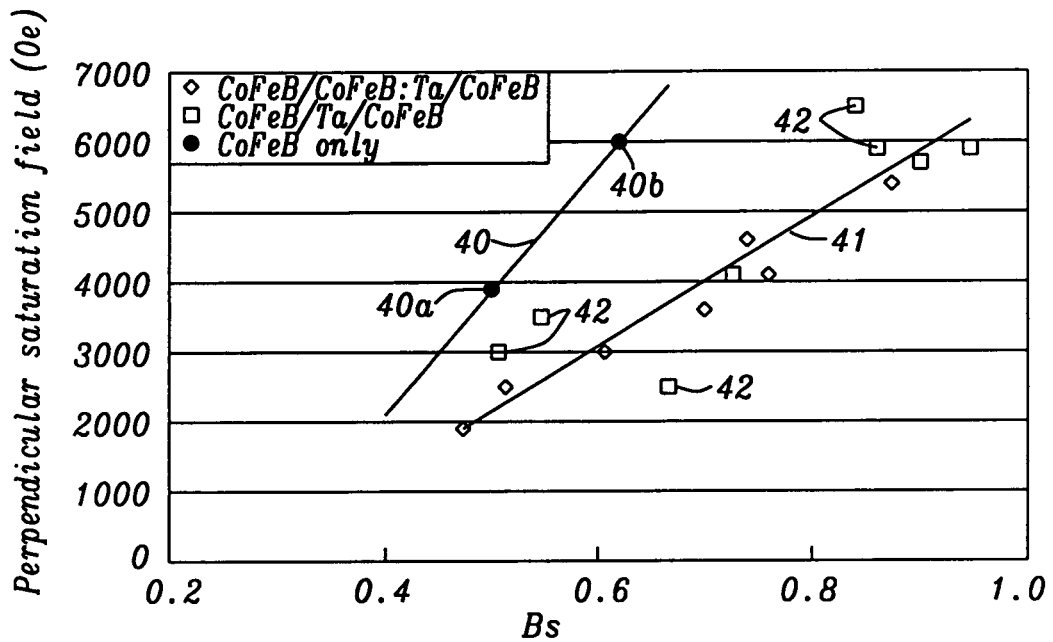
FIG. 6a is a plot showing the perpendicular saturation field as a function of the free layer total magnetic moment for a conventional free layer and a composite free layer according to embodiments of the present invention.

Referring to FIG. 6a, an experiment was performed to demonstrate the effectiveness of a magnetic element formed according to an embodiment of the present invention. In particular, the benefit of free layer moment dilution on the perpendicular saturation field is shown for samples that were annealed at 330° C. for 1 hour. Line 40 represents a reference where the free layer is a single $Co_{20}Fe_{60}B_{20}$ layer that has a thickness of 16.5 Angstroms (point 40a) to 19.5 Angstroms (point 40b) and is formed in an unpatterned bottom spin valve structure represented by NiCr/MnPt/CoFe/Ru/CoFe/MgO/$Co_{20}Fe_{60}B_{20}$/Ru where a seed layer, AFM layer, CoFe/Ru/CoFe pinned layer, MgO tunnel barrier, CoFeB free layer, and a Ru capping layer are sequentially formed on a substrate that is $Si/SiO_2$. Data points 42 represent an embodiment of the present invention wherein a non-magnetic moment diluting layer (Ta) from 1 to 2 Angstroms thick is inserted in a CoFeB free layer of variable thickness in the aforementioned bottom spin valve stack. In general, as Ta thickness increases, perpendicular saturation field and Bs decrease. Line 41 represents an embodiment of the present invention wherein an alloy layer made of CoFeB:Ta is inserted in the CoFeB free layer of the bottom spin valve stack. Total thickness of the CoFeB/CoFeB:Ta/CoFeB free layer varies between 14 and 20 Angstroms and Ta content in the middle moment diluting layer is from 16 to 35 atomic %. Perpendicular saturation field and Bs decrease as the Ta content in the moment diluting layer increases. It is important to note that for a given Bs, perpendicular saturation field is lower for lines 41, 42 than for the reference 40 because of a reduction in Ms for the composite free layers. At a given perpendicular saturation magnetization, Bs is higher for lines 41, 42 than for reference 40 which means the composite free layer of the present invention affords a higher thermal stability than a conventional free layer in a condition where PMA exceeds shape anisotropy and magnetization is perpendicular to the plane of the FM1 and FM2 layers.

Figure 6B:
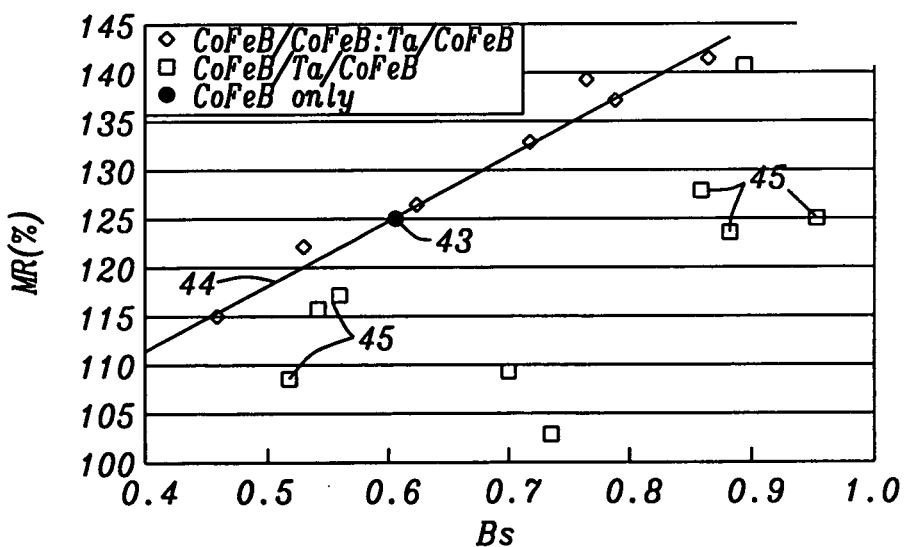
FIG. 6b is a plot depicting the TMR (MR %) as a function of the free layer magnetic moment for a conventional CoFeB layer and a composite free layer according to embodiments of the present invention.

With regard to FIG. 6b, the samples that were prepared for the experiment related to FIG. 6a were also analyzed by a CIPT to determine MR ratio. By using a certain level of Ta doping in the embodiment with a CoFeB:Ta moment diluting layer (line 44), we found the MR ratio can be matched to that of the reference sample at data point 43 while maintaining a constant Bs. In the embodiment where the moment diluting layer is a non-magnetic metal such as Ta (line 45), Ta thickness may be adjusted to yield the same MR ratio as in the reference point 43. It should be understood that data points 45 do not fall on a straight line since a wide range of Ta thickness and CoFeB thickness was used in the experiment. However, Bs and MR % are well controlled within a preferred Ta thickness range of about 0.5 to 2 Angstroms and with a preferred thickness of 8 to 11 Angstroms for each of the CoFeB layers in the composite free layer stack.

Figure 7:
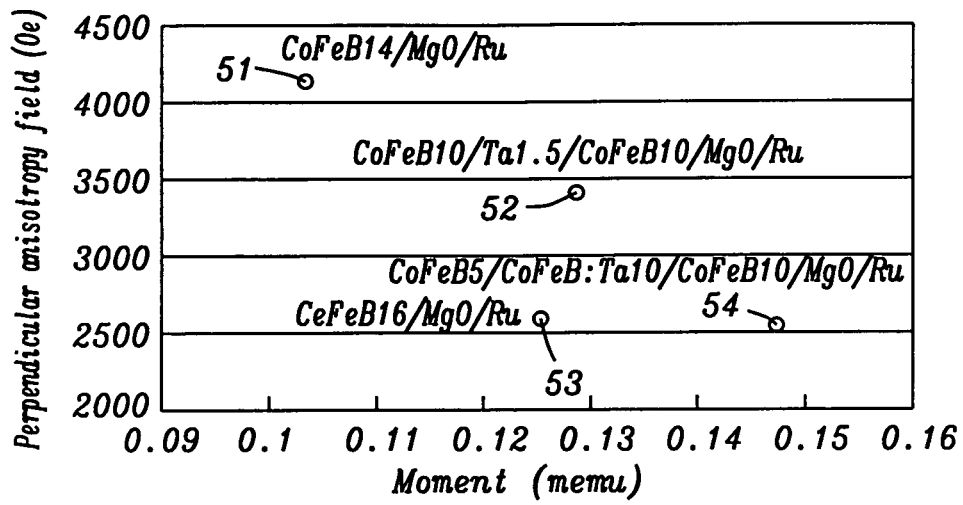
FIG. 7 is a plot of the perpendicular anisotropy field as a function of free layer magnetic moment for a conventional free layer and a composite free layer according to embodiments of the present invention.

In FIG. 7, results are shown for samples where interfacial perpendicular anisotropy dominates the total anisotropy field in the free layer and overcomes the demagnetizing field so that the free layer magnetization direction is perpendicular to the plane of the layer. The samples used in this experiment are based on a bottom spin valve configuration wherein a Ta seed layer, CoFeB magnetic (pinned) layer, MgO tunnel barrier, free layer, MgO perpendicular Hk enhancing layer, and a Ru capping layer are sequentially formed on an Si substrate in a sputter deposition tool followed by annealing at 300° C. for 1 hour with no applied field. The CoFeB free layer in the reference samples 51, 53 has a 14 Angstrom and 16 Angstrom thickness, respectively, to enable the enhanced interfacial perpendicular anisotropy field to dominate the shape anisotropy field. The MgO perpendicular Hk enhancing layer is about 6 to 7 Angstroms thick and was prepared by a NOX sequence comprising deposition of a first Mg layer 4.5 Angstroms thick, performing a NOX process, and then depositing a second Mg layer 3 Angstroms thick. The second Mg layer is oxidized during the subsequent 300° C. anneal. Measurements were obtained by using a vibrating sample magnetometer.

Sample 52 was formed according to a first embodiment of the present invention wherein the free layer is a composite with a 1.5 Angstrom thick non-magnetic Ta layer inserted between 10 Angstrom thick FM1 and FM2 layers made of $Co_{20}Fe_{60}B_{20}$. Sample 54 was formed according to a second embodiment wherein the free layer is a composite with a 10 Angstrom thick $Co_{20}Fe_{60}B_{20}$:Ta layer inserted between a 5 Angstrom thick FM1 layer and a 10 Angstrom thick FM2 layer both made of $Co_{20}Fe_{60}B_{20}$. The moment diluting layer was deposited by co-sputtering CoFeB and Ta targets to give a composition where Ta content is 25 atomic %. Results in FIG. 7 show the advantage of the present invention in enabling a higher perpendicular anisotropy field for a given moment compared with a reference 51 or 53 that has no moment diluting layer. For a given perpendicular anisotropy field, samples 52, 54 provide a higher moment which translates to higher thermal stability than the reference structures.

Figure 8:
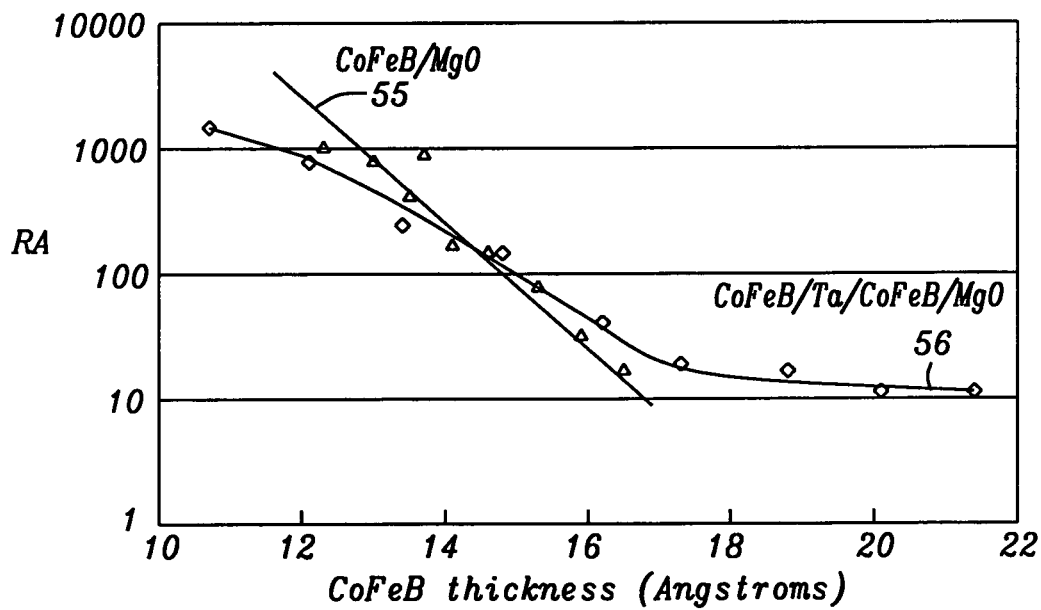
FIG. 8 is a plot showing CoFeB free layer thickness vs. RA to demonstrate the benefit of a Ta moment reducing layer formed in a CoFeB/Ta/CoFeB configuration according to the present invention.

With regard to FIG. 8, the RA benefit observed with a MTJ formed according to a first embodiment of the present invention is illustrated. Curve 55 is data generated from a reference sample that has a MgO/CoFeB/MgO tunnel barrier/free layer/perpendicular Hk enhancing layer configuration. Each data point in the plot represents a relatively large RA contribution from the MgO tunnel barrier and a second smaller RA contribution from the MgO perpendicular Hk enhancing layer. PMA character is present only up to a thickness of about 16 Angstroms but overall RA is relatively high compared with results from curve 56 that are generated from a first embodiment having a MgO/CoFeB/Ta/CoFeB/MgO tunnel barrier/composite free layer/perpendicular Hk enhancing layer configuration. With a MTJ stack of the present invention, thickness of a composite free layer with a moment diluting layer may be increased to 22 Angstroms while affording a lower RA than is achievable with a single CoFeB free layer with a similar PMA.

All layers in the magnetic elements described herein may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. Once all of the layers in the magnetic elements are laid down on a substrate, a high temperature annealing may be performed in a vacuum oven by applying a magnetic field of 0 to 10000 Oe along the y-axis (easy axis) for 1 to 5 hours at a temperature of about 240° C. to 400° C. Thereafter, an array of MTJ elements with substantially vertical sidewalls may be fabricated by a process involving a conventional photolithography patterning and reactive ion etch (RIE) sequence as is well known in the art and will not be described herein. Subsequently, an insulation layer may be deposited to electrically isolate adjacent MTJ elements. A chemical mechanical polish (CMP) process is typically employed to form a smooth top surface of the insulation layer which becomes coplanar with a top surface of the MTJ array. Then additional metal levels such as a bit line layer may be formed on the MTJs to continue the fabrication of a magnetic device.

All of the embodiments described herein may be incorporated in a manufacturing scheme with standard tools and processes. In particular, a substantial gain in thermal stability is realized without sacrificing other performance characteristics such as MR ratio which is an important advantage in enabling 64 Mb and 256 Mb STT-MRAM technology, and other magnetic devices where low switching current, low RA value, high MR ratio, and high thermal stability are critical parameters.

While this invention has been particularly shown and described with reference to, the preferred embodiment thereof, it will be understood by those skilled in the art that various changes in form and details may be made without departing from the spirit and scope of this invention.

We claim:

1. A magnetic element comprising a stack of layers including a composite free layer with at least two interfaces that produce interfacial perpendicular anisotropy, comprising:
   (a) a tunnel barrier layer;
   (b) the composite free layer having a FM1/moment diluting layer/FM2 configuration wherein both of the first ferromagnetic (FM1) layer and second ferromagnetic (FM2) layer are an Fe rich alloy with a Fe content >50 atomic % or a Co rich alloy with a Co content >50 atomic %, the FM1 layer has a first interface with the tunnel barrier layer, and the FM2 layer has a second interface with a perpendicular Hk enhancing layer, the first and second interfaces produce interfacial perpendicular anisotropy in the adjoining FM1 and FM2 layers, respectively, such that the interfacial perpendicular anisotropy dominates a shape anisotropy field and thereby establishes perpendicular magnetic anisotropy within the FM1 and FM2 layers; and
   (c) the perpendicular Hk enhancing layer.

2. The magnetic element of claim 1 wherein the FM1 and FM2 layers are made of an Fe rich alloy with one or more of Co, Ni, and B.

3. The magnetic element of claim 2 wherein each of the FM1 and FM2 layers have a thickness from about 5 to 20 Angstroms.

4. The magnetic element of claim 1 wherein the moment diluting layer is non-magnetic and is one or more of Ta, Al, Si, B, V, Ti, Mg, Hf, Cr, Cu, Ag, and Au.

5. The magnetic element of claim 1 wherein the moment diluting layer is an alloy of two or more of Co, Ni, and Fe that is doped with one or more of Ta, Al, Si, V, B, Ti, Mg, Hf, Cr, Cu, Ag, Au, or Os wherein the dopant metal content is between 5 and 50 atomic % in the alloy.

6. The magnetic element of claim 1 wherein the perpendicular Hk enhancing layer is MgO, SiOx, SrTiOx, BaTiOx, CaTiOx, LaAlOx, MnOx, VOx, AlOx, TiOx, or HfOx, or one of Ru, Ta, Ti, B, V, Mg, Ag, Au, Cu or Cr.

7. The magnetic element of claim 6 further comprised of magnetic particles made of one or more of Fe, Co, Ni, and B embedded in the perpendicular Hk enhancing layer.

8. The magnetic element of claim 1 wherein the tunnel barrier layer is comprised of MgO, AlOx, TiOx, or HfOx, or is a laminate of one or more of the aforementioned oxides.

9. The magnetic element of claim 1 wherein the magnetic element is part of a magnetic tunnel junction (MTJ) and an array of said MTJs is used for digital storage in a MRAM, spin transfer MRAM, or another spintronic device.

10. The magnetic element of claim 1 wherein the FM1 and FM2 layers are a Co rich alloy with one or more of Fe, Ni, and B.

11. A magnetic tunnel junction with a bottom spin valve configuration, comprising:
    (a) a seed layer formed on a substrate;
    (b) a pinned layer formed on the seed layer;
    (c) a tunnel barrier contacting a top surface of the pinned layer;
    (d) a composite free layer having a FM1/moment diluting layer/FM2 configuration wherein the first ferromagnetic (FM1) layer has a first interface with the tunnel barrier layer and the second ferromagnetic (FM2) layer has a second interface with a bottom surface of a perpendicular Hk enhancing layer, the first and second interfaces produce interfacial perpendicular anisotropy in the adjoining FM1 and FM2 layers, respectively, such that the interfacial perpendicular anisotropy dominates a shape anisotropy field and thereby establishes perpendicular magnetic anisotropy within the FM1 and FM2 layers;
    (e) the perpendicular Hk enhancing layer; and
    (f) a capping layer that contacts a top surface of the perpendicular Hk enhancing layer.

12. The magnetic tunnel junction of claim 11 wherein the FM1 and FM2 layers each have a thickness from about 5 to 20 Angstroms and are made of an Fe rich alloy with one or more of Co, Ni, and B, or are a Co rich alloy with one or more of Fe, Ni, and B.

13. The magnetic tunnel junction of claim 11 wherein the moment diluting layer is non-magnetic and is one or more of Ta, Al, Si, B, V, Ti, Mg, Hf, Cr, Cu, Ag, and Au.

14. The magnetic tunnel junction of claim 11 wherein the moment diluting layer is an alloy of two or more of Co, Ni, and Fe that is doped with one or more of Ta, Al, Si, V, B, Ti, Mg, Hf, Cr, Cu, Ag, Au, or Os wherein the dopant metal content is between 5 and 50 atomic % in the alloy.

15. The magnetic tunnel junction of claim 11 wherein the perpendicular Hk enhancing layer is a single layer or a laminate comprised of one or more oxides selected from MgO, SiOx, SrTiOx, BaTiOx, CaTiOx, LaAlOx, MnOx, VOx, AlOx, TiOx, and HfOx, and has a resistance x area (RA) value less than a RA value of the tunnel barrier layer.

16. The magnetic tunnel junction of claim 15 further including magnetic particles comprised of one or more of Fe, Co, Ni, and B that are embedded in the perpendicular Hk enhancing layer.

17. The magnetic tunnel junction of claim 16 wherein the tunnel barrier layer and perpendicular Hk enhancing layer are both comprised of MgO and the capping layer is made of Ru.

18. A domain wall motion device, comprising:
(a) a pinned magnetic layer having a first width;
(b) a tunnel barrier contacting a top surface of the pinned layer;
(c) a composite free layer having a width substantially larger than the first width and with a FM1/moment diluting layer/FM2 configuration wherein the first ferromagnetic (FM1) layer has a first interface with the tunnel barrier layer and the second ferromagnetic (FM2) layer has a second interface with a bottom surface of a perpendicular Hk enhancing layer, the first and second interfaces produce interfacial perpendicular anisotropy in the adjoining FM1 and FM2 layers, respectively, such that the interfacial perpendicular anisotropy dominates a shape anisotropy field and thereby establishes perpendicular magnetic anisotropy within the FM1 and FM2 layers, and wherein domain walls extend vertically through the composite free layer to establish magnetic domains including a switchable magnetic domain aligned above the pinned magnetic layer;
(d) the perpendicular Hk enhancing layer; and
(e) a capping layer that contacts a top surface of the perpendicular Hk enhancing layer, the domain wall motion device is electrically connected to a current/voltage source and to a readout device to enable read and write processes.

19. The domain wall motion device of claim 18 wherein the moment diluting layer is made of one or more of Ta, Al, Si, B, V, Ti, Mg, Hf, Cr, Cu, Ag, Au, and Os.

20. The domain wall motion device of claim 18 wherein the perpendicular Hk enhancing layer is a single layer or a laminate comprised of one or more oxides selected from MgO, SiOx, SrTiOx, BaTiOx, CaTiOx, LaAlOx, MnOx, VOx, AlOx, TiOx, and HfOx.

21. The domain wall motion device of claim 18 wherein the composite free layer is part of a wire in an array of wires that is used to store digital information.

\* \* \* \* \*